United States Patent
Hashimoto et al.

(10) Patent No.: US 8,121,732 B2
(45) Date of Patent: Feb. 21, 2012

(54) TARGET POSITION DETECTION APPARATUS FOR ROBOT

(75) Inventors: Yasuhiko Hashimoto, Kobe (JP);
Nobuyasu Shimomura, Kobe (JP);
Takao Yamaguchi, Kato-gun (JP);
Tetsuya Yoshida, Kakogawa (JP)

(73) Assignee: Kawasaki Jukogyo Kabushiki Kaisha, Kobe-shi (JP)

( * ) Notice: Subject to any disclaimer, the term of this patent is extended or adjusted under 35 U.S.C. 154(b) by 784 days.

(21) Appl. No.: 12/232,441

(22) Filed: Sep. 17, 2008

(65) Prior Publication Data
US 2009/0093908 A1   Apr. 9, 2009

(30) Foreign Application Priority Data
Oct. 5, 2007   (JP) ................... 2007-262720

(51) Int. Cl.
*G05B 19/00* (2006.01)

(52) U.S. Cl. ........ 700/260; 700/245; 700/254; 700/255; 700/258; 700/261; 318/568.1; 318/568.11; 318/568.12; 318/568.13; 318/568.16; 901/2; 901/5; 901/9; 901/15; 901/16; 324/156; 324/501; 324/750.02; 324/754.19; 324/760.01; 414/217; 414/811; 606/130

(58) Field of Classification Search ............ 700/37, 700/45, 52, 213, 245, 246, 250, 254, 255, 700/258, 260, 261; 318/41, 567, 568.1, 568.11, 318/568.12, 568.13, 568.16, 568.17, 568.18, 318/568.22, 569, 99, 640; 901/2, 5, 9, 15, 901/16, 30, 33, 46; 324/156, 501, 750.02, 324/754.19, 760.01; 219/109, 110, 121.61, 219/121.69, 124.34; 250/443.1, 559; 414/217, 414/811; 455/8, 11; 606/130; 356/244; 378/207; 348/159; 349/192
See application file for complete search history.

(56) References Cited

U.S. PATENT DOCUMENTS
5,528,116 A   6/1996 Snell
(Continued)

FOREIGN PATENT DOCUMENTS
EP   0 901 054 A1   3/1999
(Continued)

OTHER PUBLICATIONS
Fusaro, "Teach Your Robots Well," Control Design Magazine, May 2003.

*Primary Examiner* — James Trammell
*Assistant Examiner* — McDieunel Marc
(74) *Attorney, Agent, or Firm* — Oliff & Berridge, PLC

(57) ABSTRACT

A target position detection apparatus for a robot includes: a robot including an arm configured to be freely moved in at least two directions of X and Y axes, the arm having a wrist axis provided at a distal end of the arm and configured to be freely moved in a horizontal direction, the wrist axis being provided with an end effector; and a control unit adapted for driving a memory to store a teaching point therein and controlling an operation of the robot such that the end effector will be moved toward the teaching point stored in the memory. The control unit is further adapted for changing a pressing force of the end effector against a target by changing a control loop gain, and bringing the end effector into contact with the target, while setting the control loop gain of the wrist axis lower than a predetermined value at least from a position adjacent to the teaching point at which the target is located, so as to capture a position in a state in which the end effector is in contact with the target, thereby detecting the position of the target.

12 Claims, 11 Drawing Sheets

U.S. PATENT DOCUMENTS

| | | | |
|---|---|---|---|
| 6,226,565 B1 * | 5/2001 | Elfving et al. ............... 700/254 |
| 6,242,879 B1 | 6/2001 | Sagues et al. |
| 6,323,616 B1 | 11/2001 | Sagues et al. |
| 6,356,807 B1 | 3/2002 | McGee et al. |
| 6,577,923 B1 * | 6/2003 | White et al. ................ 700/245 |
| 6,920,408 B2 * | 7/2005 | Yutkowitz ................... 702/105 |
| 6,941,192 B2 * | 9/2005 | Tang et al. .................. 700/254 |
| 6,996,456 B2 * | 2/2006 | Cordell et al. ............... 700/258 |
| 7,421,314 B2 * | 9/2008 | Stoddard et al. ............. 700/245 |
| 7,424,341 B2 * | 9/2008 | Watanabe et al. ............ 700/245 |
| 7,443,124 B2 * | 10/2008 | Bischoff et al. ......... 318/568.17 |
| 7,547,209 B2 * | 6/2009 | Asari et al. .................... 432/239 |
| 7,921,690 B2 * | 4/2011 | Uebel et al. .................... 73/1.79 |
| 7,974,737 B2 * | 7/2011 | Tilove et al. .................. 700/253 |
| 7,979,159 B2 * | 7/2011 | Fixell ............................ 700/251 |
| 2011/0118873 A1 * | 5/2011 | Hashimoto et al. ........... 700/245 |
| 2011/0160897 A1 * | 6/2011 | Shimomura .................. 700/217 |

FOREIGN PATENT DOCUMENTS

| | | |
|---|---|---|
| JP | A-10-207519 | 8/1998 |
| JP | A-2006-041423 | 2/2006 |

* cited by examiner

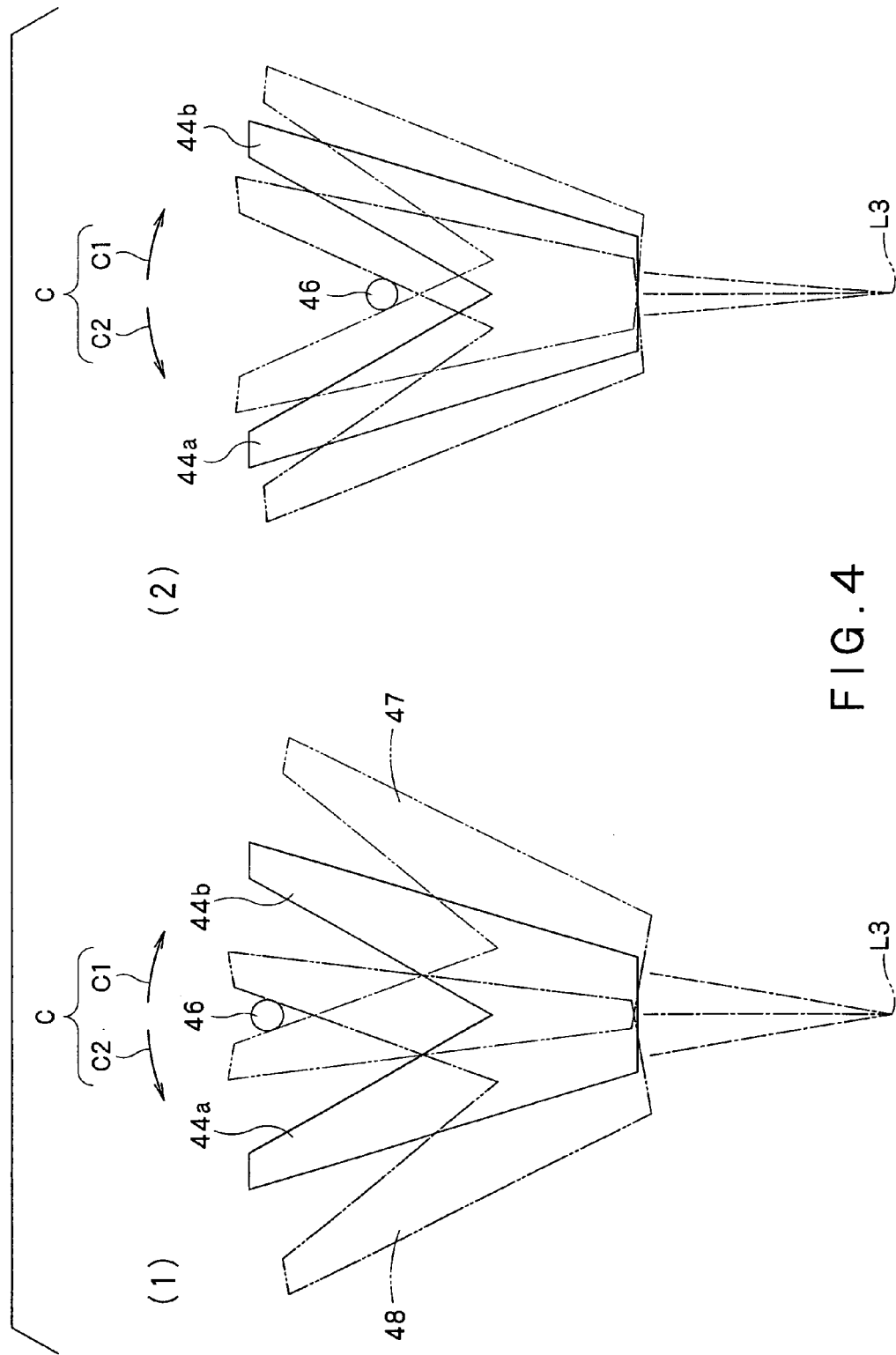
F I G. 4

TARGET POSITION DETECTION APPARATUS FOR ROBOT

CROSS REFERENCE TO RELATED APPLICATIONS

This application is based upon and claims the benefit of priority from the prior Japanese Patent Application No. 2007-262720 filed on Oct. 5, 2007, the entire contents of which are incorporated herein by reference.

BACKGROUND OF THE INVENTION

1. Field of the Invention

The present invention relates to a target position detection apparatus for a robot, and particularly to a target position detection apparatus adapted for teaching the robot about an accurate position.

2. Background Art

In the fields of the semiconductor device and liquid crystal display device, it has become more and more difficult to teach the robot, as the device has been more complicated and the size of each part or article to be carried in a process has been more increased. To teach the robot about an accurate position is very important for reliability of the robot. In such a situation, incorrect or inadequate teaching provided to the robot due to a lack of skill of an operator may lead to a serious problem. Therefore, there is a desire for a technique that can teach the robot about the accurate position, without depending on any special skill of the operator.

Around the robot, peripheral devices, such as stages and/or other mechanical parts, etc., are installed. For the teaching to the robot, it is necessary to know or judge whether or not the robot and its peripheral devices are adequately positioned and/or correctly installed relative to one another. Therefore, a further technique for automatically performing such judgment is also desired.

U.S. Pat. No. 6,242,879 (Patent Document 1) discloses a technique for obtaining a teaching point by detecting a position of a target by a three-axis-SCARA type robot. FIG. 13 is a front view of a conventional robot 1, and FIG. 14 is a plan view of the conventional robot 1. In the technique disclosed in the Patent Document 1, an end effector 2 of the robot 1 is moved toward the target provided to a cassette 3 so as to be in contact with the target. At this time, changes in the torque and speed are detected, respectively. Thus, each contact point between the end effector 2 and the target can be detected, by comparing the changes in the torque and speed in the case in which the end effector 2 is contacted with the target and those in the case in which the end effector 2 is not contacted with the target. In this way, the position of the target can be obtained from each detected contact point, as such the teaching point can be calculated.

In the technique disclosed in the Patent Document 1, deformation of the end effector and/or target and occurrence of particles may be seen when the end effector 2 is contacted with the target. In order to avoid such inconveniences, it is necessary to operate the robot 1 at a considerably low speed. In such a case, however, deterioration of accuracy in positional detection may occur since the fluctuation factors and time-dependent changing factors in a driving system for the robot 1 will become dominant. The fluctuation factors include fluctuation of torque, friction and the like. The time-dependent changing factors include hysteresis and the like.

SUMMARY OF THE INVENTION

Therefore, it is an object of this invention to provide a target position detection apparatus for a robot, which can detect the position of the target with higher accuracy.

The present invention is a target position detection apparatus for a robot, comprising: a robot including an arm configured to be freely moved in at least two directions of X and Y axes, the arm having a wrist axis provided at a distal end of the arm and configured to be freely moved in a horizontal direction, and the wrist axis being provided with an end effector; and a control unit adapted for driving a memory to store a teaching point therein and controlling an operation of the robot such that the end effector will be moved toward the teaching point stored in the memory. The control unit is further adapted for changing a pressing force of the end effector against a target by changing a control loop gain, and bringing the end effector into contact with the target, while setting the control loop gain of the wrist axis lower than a predetermined value at least from a position adjacent to the teaching point at which the target is located, so as to capture a position in a state in which the end effector is in contact with the target, thereby detecting the position of the target.

According to the present invention, the control unit brings the end effector into contact with the target, while setting the control loop gain of the wrist axis lower than a predetermined value, at least from the teaching point at which the target is located. As such, the end effector can be brought into contact with the target with adequately reduced pressing force. Thus, deformation of the end effector and/or target can be prevented, as well as occurrence of particles can be avoided or eliminated.

Besides, since the control unit captures each position in the state in which the end effector is in contact with the target, there should be no influence due to the fluctuation factors in a driving system of the robot. Accordingly, as compared with the technique disclosed in the Patent Document 1, the position of the target can be detected with higher accuracy.

Preferably in this invention, a driving unit for driving the wrist axis is configured to detect a position with a predetermined accuracy.

According to this invention, the driving unit for the wrist axis is configured to detect each position with predetermined accuracy. With a driving operation for the wrist axis by using such a driving unit, a detection error can be significantly reduced, thereby enhancing accuracy of the detection for the target position.

Preferably, in this invention, the control unit is adapted for: driving the memory to store a shape of the end effector therein; and calculating the position of the target in an X-Y plane, based on the shape of the end effector stored in the memory as well as on the position captured.

According to this invention, the shape of the end effector is stored in advance in the memory. As such, the control unit can calculate the position of the target in the X-Y plane, based on the shape of the end effector stored in the memory as well as on each captured position, thereby detecting the position of the target in the X-Y plane.

Preferably, in this invention, the end effector has a V-like shape in the X-Y plane. The control unit is adapted for moving the distal end of the arm to a plurality of positions in the X-Y plane, and bringing two points located on an inside of the end effector into contact with the target by swaying the wrist axis at each of the plurality of positions, thereby capturing each position in the state in which the end effector is in contact with the target.

According to this invention, the end effector has a V-like shape in the X-Y plane. In this case, the control unit is adapted for moving the distal end of the arm to a plurality of positions in the X-Y plane, so as to bring two points located on the inside of the end effector into contact with the target, by swaying the wrist axis, in the plurality of positions, thereby capturing each position in the state in which the end effector is in contact with the target. Based on each position captured in such a manner, the position of the target in the X-Y plane can be securely detected.

Preferably, in this invention, the end effector has a shape that is changed with respect to a radial direction of the wrist axis. The control unit is adapted for capturing the position in the state in which the end effector is in contact with the target, while moving the distal end of the arm in the X-Y plane with the end effector being in contact with the target.

According to this invention, the end effector has a shape that is changed with respect to a radial direction of the wrist axis. In this case, the control unit is adapted for capturing the position in the state in which the end effector is in contact with the target, while moving the distal end of the arm in the X-Y plane, with the end effector being in contact with the target. Consequently, the position of the target in the X-Y plane can be securely detected, based on the position captured in such a manner.

Preferably, in this invention, the distal end of the arm of the robot is configured to be freely moved in three axial directions of X, Y and Z axes. The target has a shape that is changed with respect to the Z axial direction. The control unit is adapted for: driving the memory to store the shape of the target therein; and calculating the position of the target in the Z axial direction, based on the shape of the target stored in the memory as well as on the position captured.

According to the present invention, the target has a shape that is changed with respect to the Z axial direction. Such a shape of the target is stored, in advance, in the memory. In this case, the control unit is adapted for calculating the position of the target in the Z axial direction, based on the shape of the target stored in the memory as well as on the captured position, thereby detecting the position of the target in the Z axial direction.

Preferably, in this invention, the arm is composed of a SCARA-type horizontal articulated arm having a plurality of joints. The control unit is adapted for bringing the end effector into contact with the target, while setting the control loop gain of each of the wrist axis and an arm axis lower than a predetermined value at least from a position adjacent to the teaching point at which the target is located, so as to capture the position in the state in which the end effector is in contact with the target, thereby detecting the position of the target.

According to this invention, the control unit brings the end effector into contact with the target, while setting the control loop gain of each of the wrist axis and arm axis lower than a predetermined value, at least from the position in the vicinity of the teaching point at which the target is located. Therefore, the end effector can be brought into contact with the target with substantially reduced pressing force. Thus, the deformation of the end effector and/or target can be positively prevented, as well as the occurrence of particles can be securely avoided.

Besides, since the control unit captures each position in the state in which the end effector is in contact with the target, there should be no influence due to the fluctuation factors in the driving system of the robot. Accordingly, as compared with the technique disclosed in the Patent Document 1, the position of the target can be detected more accurately.

Preferably, in this invention, a driving unit adapted for driving the arm axis is configured to detect a position with a predetermined accuracy.

According to this invention, the driving unit for the arm axis is adapted for detecting a position with predetermined accuracy. Since the arm axis is driven by using such a driving unit, the detection error can be significantly reduced, as such the position of the target can be detected with higher accuracy.

Preferably, in this invention, the robot includes a flip axis provided at the wrist axis. The end effector has a distal end spaced away from the flip axis in a direction perpendicular to the flip axis. The control unit is adapted for bringing the distal end of the end effector into contact with the target, while setting the control loop gain of the flip axis lower than a predetermined value at least from a position adjacent to the teaching point at which the target is located, and swaying the flip axis, so as to capture the position in a state in which the distal end of the end effector is in contact with the target, thereby detecting the position of the target in a Z axial direction.

According to this invention, the control unit brings the distal end of the end effector into contact with the target, while setting the control loop gain of the flip axis lower than a predetermined value as well as swaying the flip axis, at least from the teaching point at which the target is located. Thus, the distal end of the end effector can be brought into contact with the target with substantially reduced pressing force. Accordingly, the deformation of the end effector and/or target can be prevented as well as the occurrence of particles can be avoided.

Besides, since the control unit captures the position in the state in which the distal end of the end effector is in contact with the target, there should be no influence of the fluctuation factors in the driving system of the robot. Accordingly, as compared with the technique disclosed in the Patent Document 1, the position of the target in the Z axial direction can be detected with higher accuracy.

Preferably, in this invention, the end effector has a pair of distal ends, each of the distal ends being symmetrically positioned about an imaginary plane including the flip axis. The target is an opening-forming part in which an opening extending perpendicularly to the Z axial direction is formed. The control unit is adapted for moving each distal end of the end effector so as to be positioned in the opening, shifting the distal end of the arm in the Z axial direction such that a swaying angle of the flip axis will be maximum, thereby detecting a position of such a maximum swaying angle as a central position in the Z axial direction of the opening.

According to the present invention, the control unit moves each distal end of the end effector such that it will be positioned in the opening of the opening-forming part, while shifting the distal end of the arm in the Z axial direction such that a swaying angle of the flip axis will be maximum, thereby detecting a position of such a maximum swaying angle as a central position in the Z axial direction of the opening. Thus, the central position in the Z axial direction of the opening can be detected with ease and high accuracy.

The present invention is a self-diagnosis apparatus for a robot, comprising: a robot including an arm configured to be freely moved in at least two directions of X and Y axes, the arm having a wrist axis provided at a distal end of the arm and configured to be freely moved in a horizontal direction, and the wrist axis being provided with an end effector; and a control unit adapted for driving a memory to store a teaching point therein and controlling an operation of the robot such that the end effector is moved toward the teaching point stored in the memory. The control unit is further adapted for: changing a pressing force of the end effector against a target by changing a control loop gain; setting the control loop gain of the wrist axis lower than a predetermined value in a state in which an angular displacement of the end effector about the wrist axis is prevented by the target, and first changing an instruction value to the wrist axis such that the end effector will be moved in one circumferential direction of the wrist axis, thereby capturing a position after changing the instruction value, and then changing the instruction value to the wrist axis such that the end effector will be moved in an other circumferential direction of the wrist axis, thereby capturing a position after changing the instruction value; and judging a state of the robot based on a difference between the positions captured.

According to this invention, the control unit is adapted for setting the control loop gain of the wrist axis lower than a predetermined value, in the state in which the angular displacement of the end effector about the wrist axis is prevented by the target. In this state, the control unit changes the instruction value provided to the wrist axis. As such, the end effector can be brought into contact with the target with significantly reduced pressing force. Accordingly, the deformation of the end effector and/or target can be prevented as well as the occurrence of particles can be avoided.

The control unit is adapted for first changing the instruction value provided to the wrist axis such that the end effector will be moved in the one circumferential direction of the wrist axis, thereby capturing the position after the change, and then changing the instruction value provided to the wrist axis such that the end effector will be moved in the other circumferential direction of the wrist axis, thereby capturing the position after the change. As a result, the control unit judges a state of the robot, based on the difference between the positions captured. Accordingly, the state of the robot, especially the state of the wrist axis, can be judged with ease.

Preferably, in this invention, the arm is composed of a SCARA-type horizontal articulated arm having a plurality of joints. The control unit is adapted for: setting the control loop gain of an arm axis to be diagnosed lower than a predetermined value in a state in which the angular displacement of the end effector about the arm axis is prevented by the target, and first changing an instruction value to the arm axis such that the end effector will be moved in one circumferential direction of the arm axis, thereby capturing a position after changing the instruction value, and then changing the instruction value to the arm axis such that the end effector will be moved in an other circumferential direction of the arm axis, thereby capturing a position after changing the instruction value; and judging the state of the robot based on the difference between the positions captured.

According to this invention, the control unit is adapted for setting the control loop gain of the arm axis lower than a predetermined value, in the state in which the angular displacement of the end effector about the arm axis to be diagnosed is prevented by the target. In this state, the control unit changes the instruction value provided to the arm axis. As such, the end effector can be brought into contact with the target with significantly reduced pressing force. Accordingly, the deformation of the end effector and/or target can be prevented as well as the occurrence of particles can be avoided.

The control unit is adapted for first changing the instruction value provided to the arm axis such that the end effector will be moved in the one circumferential direction of the arm axis, thereby capturing the position after the change, and then changing the instruction value provided to the arm axis such that the end effector will be moved in the other circumferential direction of the arm axis, thereby capturing the position after the change. Thereafter, the control unit judges a state of the robot, based on the difference between the positions captured. Accordingly, the state of the robot, especially the state of the arm axis, can be judged with ease.

BRIEF DESCRIPTION OF THE DRAWINGS

The above and other objects, features and advantages of the present invention will become more apparent from the following description taken in connection with the accompanying drawings, in which:

FIG. 4 is a diagram for illustrating an operation continued from the operation shown in FIG. 3;

DESCRIPTION OF THE PREFERRED EMBODIMENTS

Figure 1:
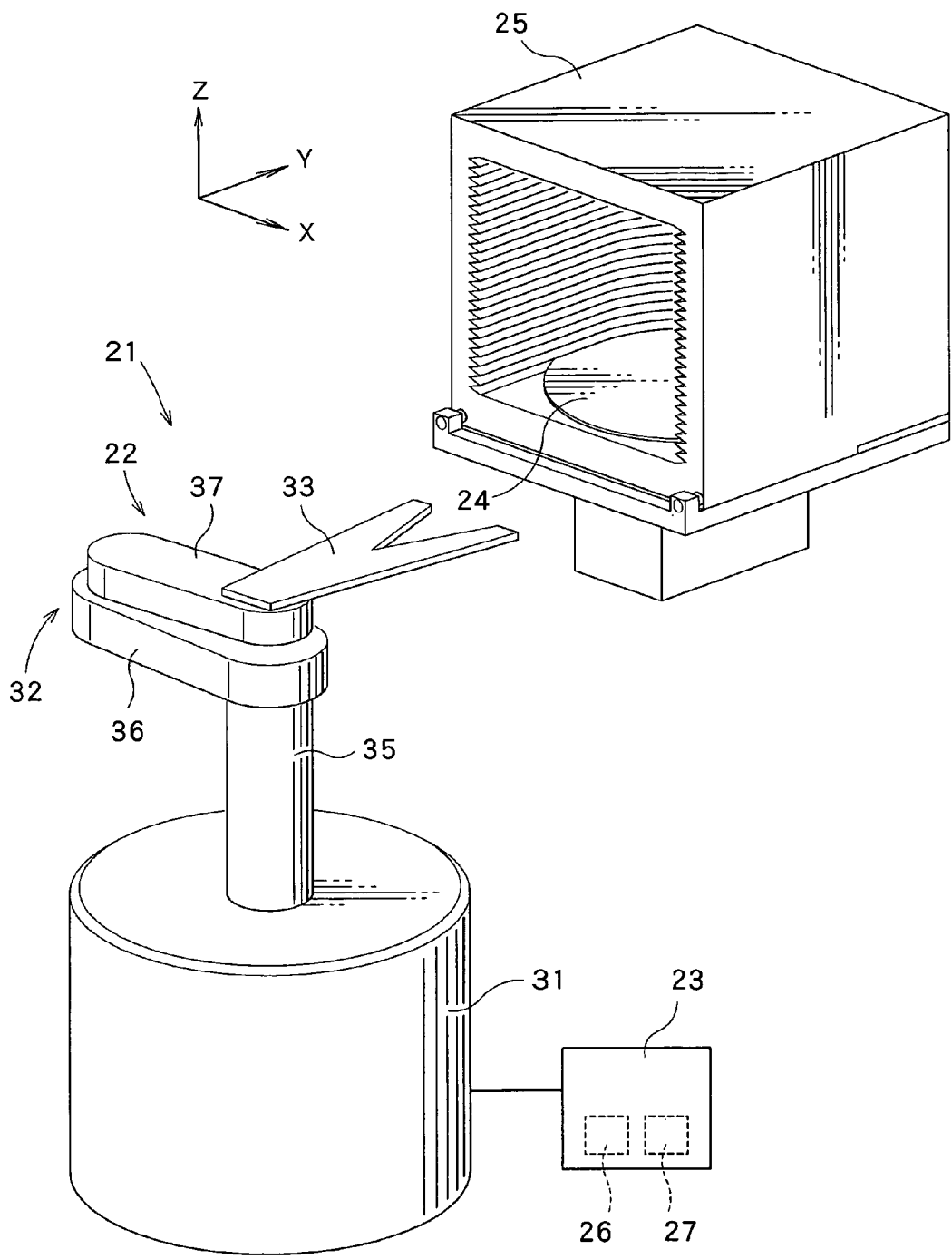
FIG. 1 is a perspective view showing construction of a target position detection apparatus 21 for a robot, which is a first embodiment of the present invention.

Referring to FIG. 1, the target position detection apparatus 21 for the robot is used for teaching the robot about an accurate position. The position detection apparatus 21 includes a robot 22 and a control unit 23 for controlling the operation of the robot 22.

The robot 22 is used as a work carrier adapted for carrying a disc-like or plate-like work. As the work, a semiconductor wafer 24 (herein after, merely referred to as a "wafer"), such as a silicon wafer, can be mentioned.

The robot 22 serves to put in and take out the wafer 24 for a cassette 25. More specifically, the robot 22 takes out the wafer 24 placed in the cassette 25, and carries it to a predetermined processing position. In addition, the robot 22 receives the wafer 24 located in the predetermined processing position, and puts it into the cassette 25. The wafer 24 is processed by a processing apparatus in the predetermined processing position. The processing apparatus provides a predetermined process to the wafer 24. As the predetermined process, etching and the like can be mentioned.

The control unit 23 controls a memory 26 to store each teaching point therein, so as to operate the robot 22 such that a hand 33 that is an end effector can be moved to the teaching point stored in the memory 26. The control unit 23 can be achieved by employing a computer. The control unit 23 includes the memory 26 adapted for storing therein a predetermined carrier operational program, and a control part 27 adapted for performing the carrier operational program stored in the memory 26 and controlling each driving unit 55 to 58 which will be described later.

Figure 2:
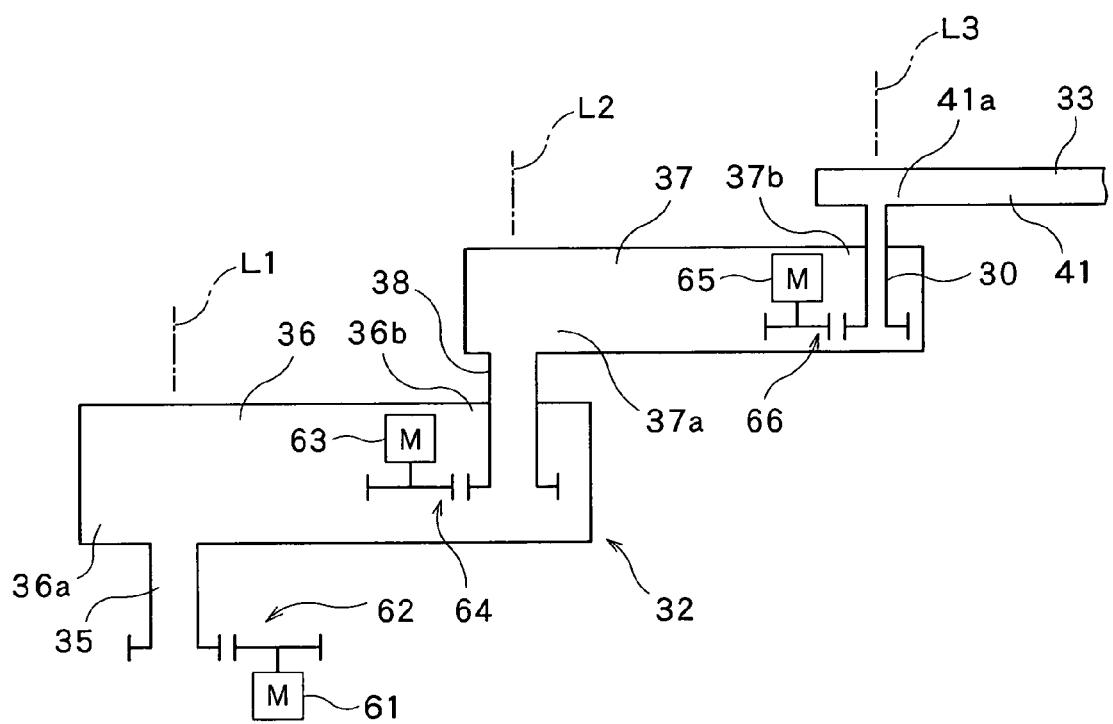
FIG. 2 is a schematic view showing construction of a robot 22.

FIG. 2 is a schematic view showing the construction of a robot 22. As is also shown in FIG. 1, the robot 22 includes an arm 32 configured to be freely moved along three axial directions, i.e., X axis, Y axis and Z axis. The arm 32 has a wrist axis 30 provided at a distal end of the arm 32. The wrist axis 30 is configured to be freely moved in a horizontal direction, and is provided with a hand 33. In addition to the arm 32 and hand 33, the robot 22 includes a base 31.

The arm 32 is composed of a SCARA-type horizontal articulated arm having a plurality of joints. The arm 32 includes a base part 35 which extends along a first axis L1 to form a first arm axis, and first and second arm parts 36, 37. The base part (first arm axis) 35 is movably connected with the base 31. The base part 35 can be angularly displaced about the first axis L1 relative to the base 31 as well as slidably moved along the first axis L1. In this embodiment, the first axis L1 extends in the vertical direction. Each of the first and second arms 36, 37 is formed into an elongated shape. One end 36a in a longitudinal direction of the first arm 36 is fixedly connected with the base part 35. The other end 36b in the longitudinal direction of the first arm 36 is connected with one end 37a in a longitudinal direction of the second arm 37 via a second arm axis 38 which extends along a second axis L2. The second arm 37 can be angularly displaced about the second axis L2 relative to the first arm 36. The second axis L2 is parallel to the first axis L1.

The hand 33 is configured to support the wafer 24 from below. The hand 33 includes a connecting part 41 connected with the arm 32, and a supporting part 42 connected with the connecting part 41 and configured for supporting the wafer 24 (see FIG. 3). The connecting part 41 is formed into an elongated shape. One end 41a in a longitudinal direction of the connecting part 41 is connected with the other end 37b in the longitudinal direction of the second arm 37 via the wrist axis 30 which extends in a third axis L3. The connecting part 41 is configured to be angularly displaced about the third axis L3 relative to the second arm 37. The third axis L3 is parallel to the first axis L1. The supporting part 42 is formed into a V-like shape. The supporting part 42 includes a base part 43 and a pair of extending parts 44a, 44b each connected with the base 43. The base part 43 is fixedly attached to the other end 41b in the longitudinal direction of the connecting part 41. The extending parts 44a, 44b are spaced away from each other in a circumferential direction C of the third axis L3, and are provided to be symmetrical about an imaginary plane P1 including the third axis L3.

As already mentioned, in this embodiment, the robot 22 includes the first and second arm axes 35, 38 and the wrist axis 30. The first arm axis 35 can be angularly displaced about the first axis L1. The second arm axis 38 is configured to be angularly displaced about the second axis L2. The wrist axis 30 can be angularly displaced about the third axis L3.

Figure 3:
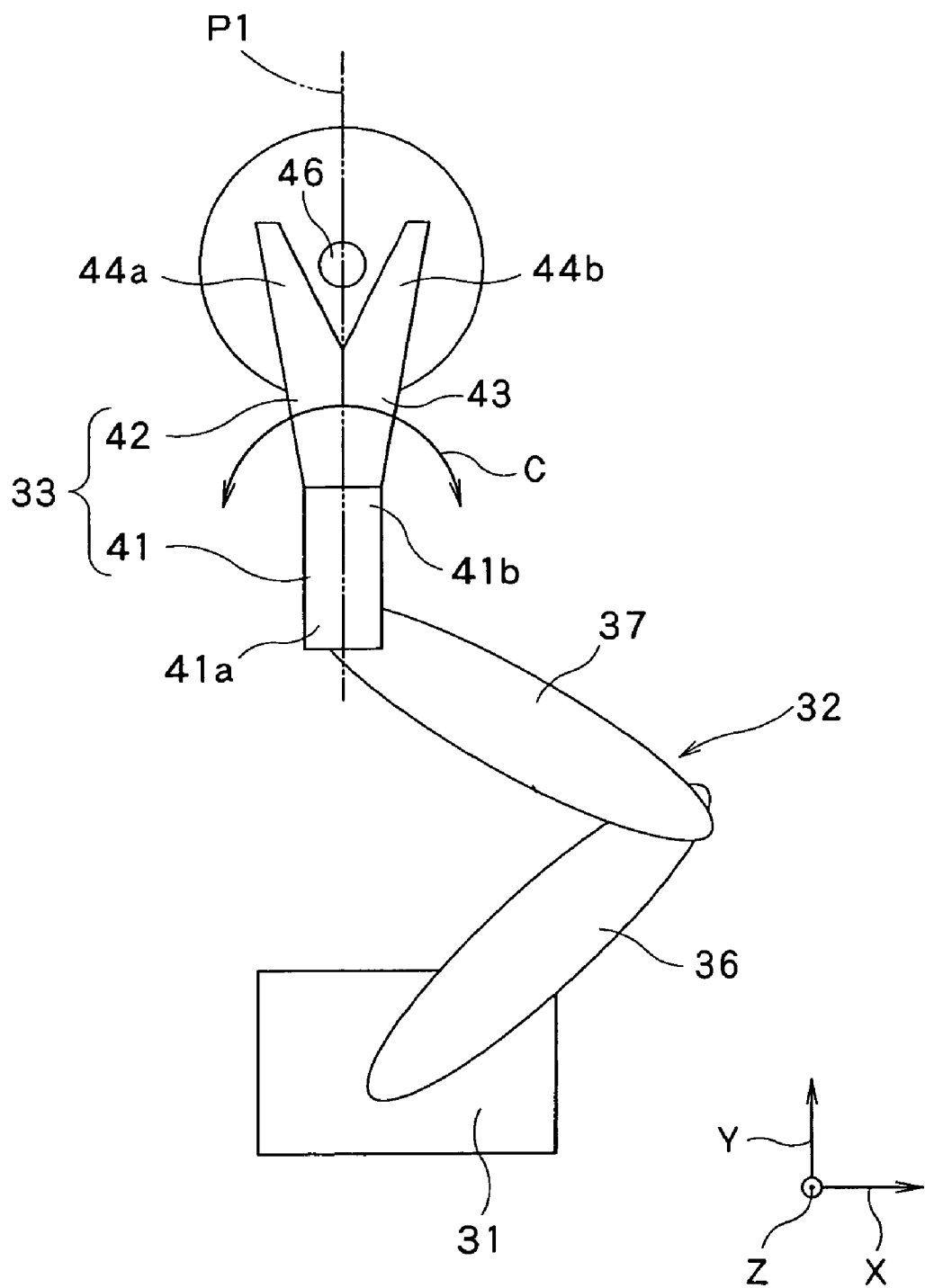
FIG. 3 is a diagram for illustrating an operation for detecting a target position in an X-Y plane.

FIG. 3 is a diagram for illustrating an operation for detecting a target position in an X-Y plane. A target 46 is located in a predetermined position. For instance, the target 46 is provided, in advance, to a cassette 25 or the like. In this embodiment, the target 46 extends in the Z axial direction, and is formed into a columnar shape. It is noted that the Z axial direction corresponds to the vertical direction.

In the memory 26, the teaching point at which the target 46 is located is stored in advance. The control unit 23 controls the operation of the robot 22 such that the hand 33 can be moved toward the teaching point stored in the memory 26. In this way, the control unit moves the hand 33 to a position in the vicinity of the teaching point. More specifically, as shown in FIG. 3, the control unit 23 operates the hand 33 to take such a position that the target 46 will be located between the extending parts 44a, 44b of the hand 33.

FIG. 4 is a diagram for illustrating an operation continued from the operation shown in FIG. 3. FIG. 4(1) shows a state in which a distal end of the arm 32 is kept in a first position, and FIG. 4(2) shows a state in which the distal end of the arm 32 is kept in a second position. The control unit 23 is adapted for changing the pressing force of the hand 33 against the target 46 by changing each control loop gain. The control loop gain includes a position loop gain and a speed loop gain.

Specifically, the control unit 23 brings the hand 33 into contact with the target 46, while setting the control loop gain of the wrist axis 30 lower than a predetermined value, at least from a position in the vicinity of the teaching point at which the target 46 is located. The predetermined value is selected as one less than a value of the control loop gain when the wafer 24 is carried. The control loop gain of the wrist axis 30 may be lowered after the hand 33 is moved up to the position in the vicinity of the teaching point at which the target 46 is located, or otherwise may be lowered from the start. Due to such control for lowering the control loop gain of the wrist axis 30, the hand 33 can be brought into contact with the target 46 with significantly reduced the pressing force. Thus, deformation of the hand 33 and/or target 46 can be prevented, as well as occurrence of particles can be successfully avoided.

In this embodiment, the control unit 23 can change the pressing force of the hand 33 against the target 46, also by changing an upper limit of driving electric current or upper limit of driving torque. Namely, the control unit 23 brings the hand 33 into contact with the target 46, while setting the upper limit of driving torque of the wrist axis 30 lower than a predetermined value, at least from a position in the vicinity of the teaching point at which the target 46 is located. This predetermined value is selected as one less than the upper limit of the driving torque when the wafer 24 is carried. The upper limit of the driving torque of the wrist axis 30 may be lowered after the hand 33 is moved up to the position in the vicinity of the teaching point at which the target 46 is located, or otherwise may be lowered from the start. Also due to such control for lowering the upper limit of the driving torque of the wrist axis 30, the hand 33 can be in contact with the target 46 with securely reduced the pressing force. Thus, the deformation of the hand 33 and/or target 46 can be securely prevented as well as the occurrence of particles can be surely avoided.

Besides, the control unit 23 is adapted for capturing each position in a state in which the hand 33 is in contact with the target 46. More specifically, the control unit 23 captures a present or current value of each of the wrist axis 30 and arm axes 35, 38, in the state in which the hand 33 is in contact with the target 46. Due to such a capturing operation for each position in the state in which the hand 33 is in contact with the target 46, there should be no influence of the fluctuation factors in the driving system of the robot 22. Accordingly, as compared with the technique disclosed in the Patent Document 1, the position of the target 46 can be detected with higher accuracy.

More specifically, after moving the hand 33 to the position in the vicinity of the teaching point, the control unit 23 brings two points, each located on the inside of the hand 33, into contact with the target 46, respectively, by driving the wrist axis 30 to sway the hand 33 about the third axis L3, while keeping the distal end of the arm 32 located in the first position as shown in FIG. 4(1), so as to capture each position in which the hand 33 is in contact with the target 46. When the distal end of the arm 32 is located in the first position, the target 46 is present between the extending parts 44a, 44b of the hand 33. Namely, in the first position, the control unit 23 can bring each extending part 44a, 44b into contact with the target 46.

Upon capturing the position by contacting one extending part 44a with the target 46, the control unit 23 changes an instruction value given to the wrist axis 30, such that the hand 33 will be moved in one circumferential direction C1 of the wrist axis. In this case, since the target 46 is located in front of the one extending part 44a, the movement of the hand 33 will be stopped by the target 46 from a point of time at which the one extending part 44a is brought into contact with the target 46, as shown by an imaginary line 47 in FIG. 4(1). As a result, when a difference between the instruction value of the wrist axis 30 and the current value of the wrist axis 30 exceeds a predetermined value, the control unit 23 will capture the current value of each of the wrist axis 30 and arm axes 35, 38 as the position in which the one extending part 44a is in contract with the target 46.

On the other hand, upon capturing the position by contacting the other extending part 44b with the target 46, the control unit 23 changes the instruction value provided to the wrist axis 30 such that the hand 33 will be moved in the other circumferential direction C2 of the wrist axis 30. In this case, since the target 46 is located in front of the other extending part 44b, the movement of the hand 33 will be stopped by the target 46 from a point of time at which the other extending part 44b is brought into contact with the target 46, as shown by an imaginary line 48 in FIG. 4(2). In this way, when the difference between the instruction value of the wrist axis 30 and the current value of the wrist axis 30 exceeds a predetermined value, the control unit 23 will capture the current value of each of the wrist axis 30 and arm axes 35, 38 as the position in which the other extending part 44b is in contract with the target 46.

In this embodiment, while the control unit 23 captures the current value of each of the wrist axis 30 and arm axes 35, 38 when the difference between the instruction value of the wrist axis 30 and the current value of the wrist axis 30 exceeds a predetermined value, the timing of capturing the current value of each of the wrist axis 30 and arm axes 35, 38 is not limited to this aspect. For instance, the current value of each of the wrist axis 30 and arm axes 35, 38 may be captured when the instruction value of the wrist axis 30 reaches a preset value. In this case, the preset value should be set at a value such that the hand 33 can be securely in contact with the target 46.

Once capturing each position as described above while keeping the distal end of the arm 32 located in the first position, the control unit 23 will move the distal end of the arm 32 from the first position to the second position. The second position is defined as a different position, in the X-Y plane, from the first position. However, also in the case in which the distal end of the arm 32 is located in the second position, the target 46 is still present between the extending parts 44a, 44b of the hand 33.

Thereafter, the control unit 23 will capture each position in the state in which the hand 33 is in contact with the target 46, by bringing the two points, each located on the inside of the hand 33, into contact with the target 46, while driving the wrist axis 30 to sway the hand 33, with the distal end of the arm 32 being kept in the second position, as shown in FIG. 4(2). This capturing operation is substantially the same as the capturing operation described above, as such the description for details about this operation is now omitted.

In this way, the control unit 23 captures each position in the state in which the hand 33 is in contact with the target 46, and then bringing the two points, each located on the inside of the hand 33, into contact with the target 46, while driving the wrist axis 30 to sway the hand 33, with moving the distal end of the arm 32 to a plurality of positions in the X-Y plane. In this embodiment, the plurality of positions correspond to the first and second positions as described above, respectively. Based on each position captured in such a manner, the position of the target 46 in the X-Y plane can be detected.

Figure 5:
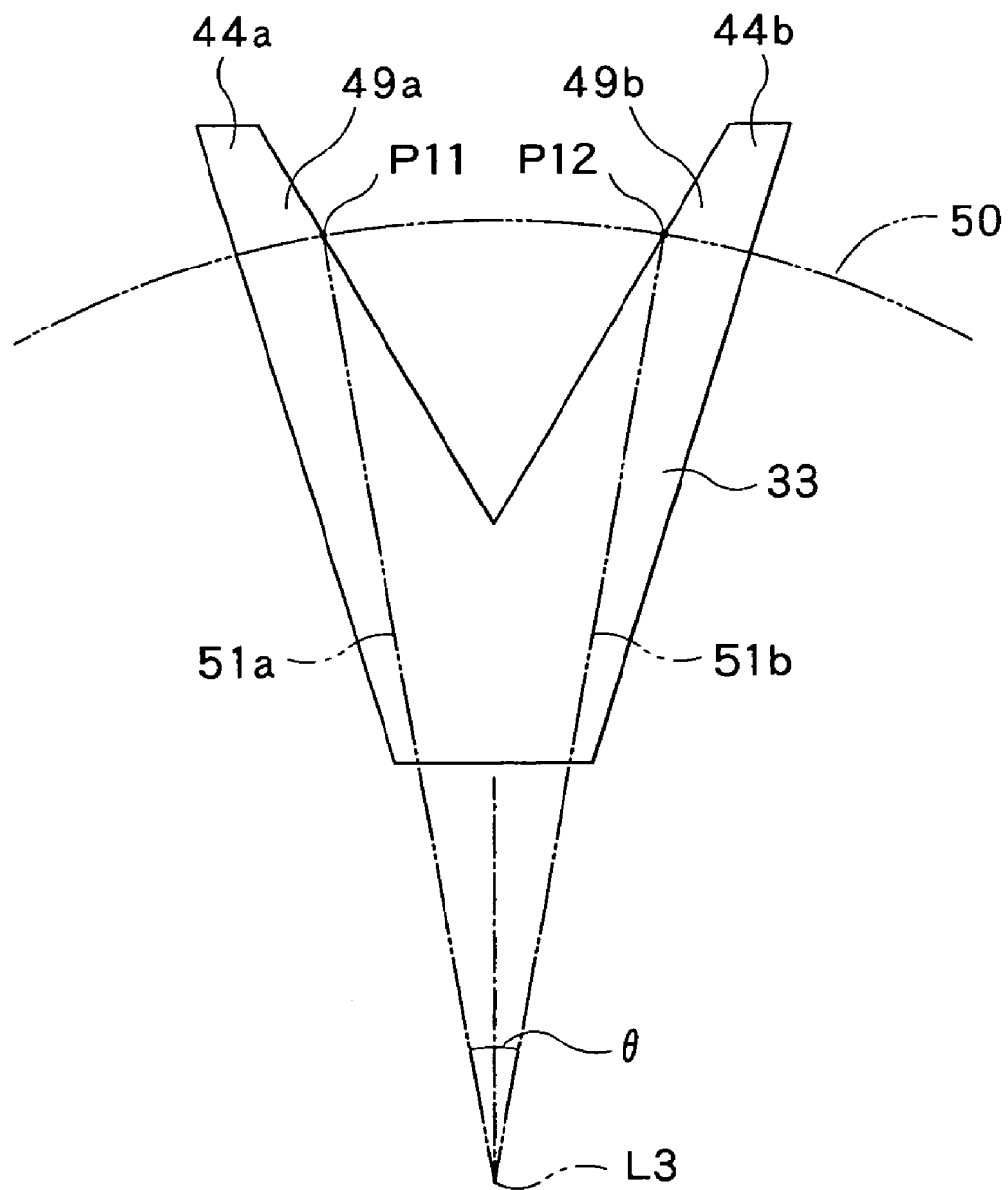
FIG. 5 is a plan view of a hand 33.

FIG. 5 is a plan view of the hand 33. In the memory 26, a shape of the hand 33 is stored in advance. The control unit 23 calculates the position of the target 46 in the X-Y plane, based on the shape of the hand 33 stored in the memory 26 as well as on each captured position, thereby detecting the position of the target 46 in the X-Y plane.

In the extending parts 44a, 44b of the hand 33, contacting portions 49a, 49b for contacting the target 46 are provided, respectively. Each contacting portion 49a, 49b is provided on the inside of the hand 33. Now, assuming an imaginary plane extending perpendicular to the wrist axis 30, an imaginary circle 50 on the imaginary plane is centered on the third axis L3 of the wrist axis 30. In this case, the imaginary circle 50 intersects each contacting portion 49a, 49b. A point at which the one contacting portion 49a intersects the imaginary circle 50 will be referred to as a first intersection point P11, and another point at which the other contacting portion 49b intersects the imaginary circle 50 will be referred to as a second intersection point P12. Furthermore, an assumed line segment 51a connecting the first intersection point P11 with the third axis L3 of the wrist axis 30 and another assumed line segment 51b connecting the second intersection point P12 with the third axis L3 of the wrist axis 30 are depicted in the imaginary plane. In this case, an angle θ formed between the line segments 51a, 51b will be increased or decreased, with a change of a radius of the imaginary circle 50. In an example shown in FIG. 5, the angle θ defined between the line segments 51a, 51b will be decreased as the radius of the imaginary circle 50 is decreased.

Taking into account the shape of the hand 33, information indicating a relationship between a difference (θ11-θ12) of the current value θ11 of the wrist axis 30 in a state in which the one extending part 44a is in contact with the target 46 and the current value θ12 of the wrist axis 30 in a state in which the other extending part 44b is in contact with the target 46 and a distance R from the third axis L3 of the wrist axis 30 to the target 46 is stored in advance in the memory 26, as a shape of the hand 33. With such information, the control unit 23 can calculate and obtain the distance from the third axis 3 of the wrist axis 30 to the target 46, based on each captured position.

Furthermore, the control unit 23 moves the distal end of the arm 32 to a plurality of positions in the X-Y plane, so as to calculate and obtain each distance from the third axis L3 of the wrist axis 30 to the target 46, in such a plurality of positions, in the same manner as described above. In this way, the control unit 23 can obtain each distance from the third axis L3 of the wrist axis 30 to the target 46 in the plurality of positions, thereby specifying the position of the target 46 in the X-Y plane.

Figure 6:
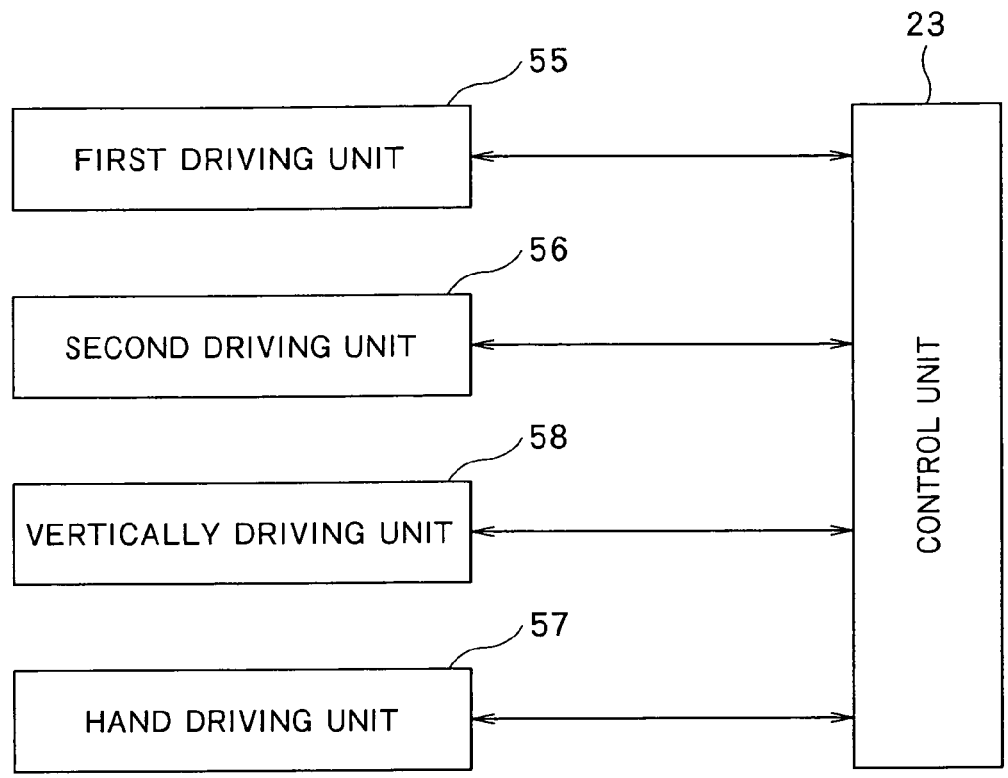
FIG. 6 is a block diagram for illustrating electrical construction of the robot 22.

FIG. 6 is a block diagram for illustrating the electrical construction of the robot 22. The robot 22 includes first and second arm driving unit 55, 56, a hand driving unit 57, and a vertically driving unit 58.

The first arm driving unit 55 is adapted for angularly displacing the base part (first arm axis) 35 about the first axis L1 relative to the base 31, thereby angularly displacing the first arm 36 fixed to the base part 35 about the first axis L1 relative to the base 31. The second arm driving unit 56 is adapted for angularly displacing the second arm axis 38 about the second axis L2 relative to the first arm 36, thereby angularly displacing the second arm 37 fixed to the second arm axis 38 about the second axis L2 relative to the first arm 36. The hand driving unit 57 is adapted for angularly displacing the wrist axis 30 about the third axis L3 relative to the second arm 37, thereby angularly displacing the hand 33 about the third axis L3 relative to the second arm 37. Each driving unit 55 to 57 can be achieved by a rotary motor adapted for controlling angular displacement, such as by a servo-motor incorporating an encoder therein.

The vertically driving unit 58 is adapted for providing slidable displacement to the base part 35 along the first axis L1 relative to the base 31. The vertically driving unit 58 can be achieved by a ball-screw mechanism using a rotary motor that can control angular displacement. Specifically, the vertically driving unit 58 includes a screw rod, an engaging member configured to be engaged with the screw rod, and the rotary motor adapted for rotating and driving the screw rod. To the engaging member, the base part 35 is fixed. For instance, the rotary motor can be achieved by a servo-motor incorporating an encoder therein.

The control unit 23 controls each driving unit 55 to 58 described above. Specifically, the control unit 23 controls each driving unit 55 to 58, so as to first hold the wafer 24 located in a predetermined position from which the wafer 24 is carried, and then carry the wafer 24 to another predetermined position to which the wafer 24 is to be carried. The control unit 23 can perform feed-back control for each driving unit 55 to 58, by obtaining an angular position of each servo-motor from the encoder provided in the servo-motor of each driving unit 55 to 58, thereby achieving higher accuracy alignment to a target position.

Referring again to FIG. 2, a power transmission mechanism will be described. The first arm driving unit 55 is provided in an internal space of the base 31, the second arm driving unit 56 is provided in an internal space of the first arm 36, and the hand driving unit 57 is provided in an internal space of the second arm 37.

Each of the first and second arm driving unit 55, 56 serves as a means adapted for driving each arm axis 35, 38. In addition, each of the first and second arm driving unit 55, 56 is adapted for detecting a position with predetermined accuracy. This accuracy is selected at a level required upon carrying the wafer 24. In such a manner, since each arm axis 35, 38 is driven by each arm driving unit 55, 56, a detection error can be adequately reduced, thereby providing higher accuracy detection for the position of the target 46. In addition, since the driving unit 55, 56 is provided for each arm axis 35, 38, the detection error can be further reduced, as such the position of the target 46 can be detected with significantly higher accuracy.

The first arm driving unit 55 includes a servo-motor 61 and a power transmission unit 62. The power transmission unit 62 transmits power of the servo-motor 61 to the base part 35. For the power transmission unit 62, a gear type power transmission mechanism is used. The power transmission unit 62 further includes a reduction gear. The servo-motor 61 transmits the power to an input part of the reduction gear, as rotational power. For the power transmitted to the input part of the reduction gear, the torque is amplified at a preset amplification ratio, while the rotation speed is reduced at a preset reduction ratio. In this way, the resultant power will be outputted from an output part. The power outputted from the output part is then transmitted to the base part 35 via a group of gears. As such, the base part 35 will be angularly displaced about the first axis L1, thus the first arm 36 fixed to the base part 35 will also be angularly displaced about the first axis L1.

The second arm driving unit 56 includes a servo-motor 63 and a power transmission unit 64. The power transmission unit 64 transmits power of the servo-motor 63 to the second arm axis 38 fixed to the second arm 37. For the power transmission unit 64, a gear type power transmission mechanism is used. The power transmission unit 64 further includes a reduction gear. The servo-motor 63 transmits the power to an input part of the reduction gear, as rotational power. For the rotational power transmitted to the input part of the reduction gear, the torque is amplified at a preset amplification ratio, while the rotation speed is reduced at a preset reduction ratio. In this way, the resultant power will be outputted from an output part. The power outputted from the output part is then transmitted to the second arm axis 38 of the second arm 37 via a group of gears. As such, the second arm axis 38 will be angularly displaced about the second axis L2, thereby the second arm 37 will be angularly displaced about the second axis L2.

In this embodiment, while the gear type power transmission mechanism is employed for each arm axis 35, 38, a direct drive motor may be used for each arm axis 35, 38. In this case, the detection error can be reduced as much as possible, thereby detecting the position of the target 46 with further higher accuracy.

The hand driving unit 57 serves as a means adapted for driving the wrist axis 30. The hand driving unit 57 is configured to detect a position with predetermined accuracy. The predetermined accuracy is selected as one required upon carrying the wafer 24. Since the wrist axis 30 is driven by such a hand driving unit 57, the detection error can be significantly reduced and the position of the target 46 can be detected with high accuracy. For instance, in the case in which the position is detected via a transmission unit, such as an arm link and/or timing belt in the arm, the detection error may tend to occur, due to influence of the hysteresis of the driving system and/or other axes provided in the middle of a transfer route. In this embodiment, however, such a detection error can be significantly reduced.

The hand driving unit 57 includes a servo-motor 65 and a power transmission unit 66. The power transmission unit 66 transmits power of the servo-motor 65 to the wrist axis 30 fixed to the hand 33. For the power transmission unit 66, a gear type power transmission mechanism is used. The power transmission unit 66 further includes a reduction gear. The servo-motor 65 transmits the power to an input part of the reduction gear, as rotational power. For the rotational power transmitted to the input part of the reduction gear, the torque is amplified at a preset amplification ratio, while the rotation speed is reduced at a preset reduction ratio. In this way, the resultant power will be outputted from an output part. The power outputted from the output part is then transmitted to the wrist axis 30 fixed to the hand 33 via a group of gears. As such, the wrist axis 30 will be angularly displaced about the third axis L3, thereby the hand 33 will be angularly displaced about the third axis L3.

In this embodiment, while the gear type power transmission mechanism is employed for the wrist axis 30, a proper direct drive motor may be used for the wrist axis 30. In this case, the detection error can be reduced as much as possible, thereby detecting the position of the target 46 with further higher accuracy.

Figure 7:
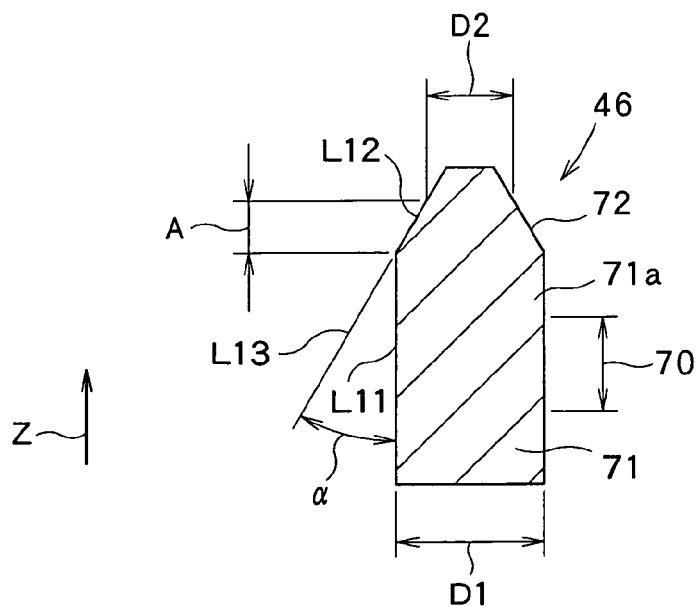
FIG. 7 is a section of a target 46.

FIG. 7 is a section of one example of the target 46. With reference to FIG. 7, an operation related to the position detection for the target in the Z axial direction will be described. The target 46 has a shape that is changed along the Z axial direction. Specifically, the target 46 extends in the Z axial direction, and is formed into a columnar shape having a top portion which is tapered toward its top end. In other words, the target 46 includes a columnar main body 71 extending in the Z axial direction and a distal portion 72 connected to an upper end portion 71a of the main body 71 and having a truncated-cone-like shape tapered upwardly. The main body 71 and distal portion 72 are coaxial relative to each other, and a top face of the main body 71 and a bottom face of the distal portion 72 are coplanar relative to each other. The main body 71 projects upward and downward from a range 70 of a mechanical error, such as an installation error. When seen in a section of such a target 46 taken along an imaginary plane including its axis, an angle, defined by an intersection line L11 between an outer circumferential face of the main body 71 and the imaginary plane and a line L13 extending below from an intersection line L12 between an outer circumferential face of the distal portion 72 and the imaginary plane, will be referred to as an "angle α."

In the memory 26, the shape of the target 46 is stored in advance. The control unit 23 can detect the position of the target 46 in the Z axial direction, based on the shape of the target 46 stored in the memory 26 and each position captured by the control unit.

Upon detecting the position of the target 46 in the Z axial direction, the control unit 23 first moves the hand 33 to a position in the vicinity of the teaching point at which the target 46 is located. Subsequently, the control unit 23 elevates the distal end of the arm 32, and then sets the control loop gain of the wrist axis 30 lower than a predetermined value while lowering the upper limit of the driving torque of the wrist axis 30 lower than another predetermined value, in a plurality of positions with respect to the Z axial direction. During this operation, the control unit 23 brings the two points, each located on the inside of the hand 33, into contact with the target 46, respectively, while driving the wrist axis 30 to sway the hand 33, thereby capturing each position in the state in which the hand 33 is in contact with the target 46. As a result, the control unit 23 can detect the position of the target 46 in the Z axial direction, based on each captured position.

More specifically, the control unit 23 obtains a diameter of the target 46, from each captured position, with respect to the plurality of positions along the Z axial direction. The diameter of the target 46 is constant during a period of time the hand 33 is in contact with the main body 71 of the target 46, while it will be smaller than the case in which the hand 33 is in contact with the main body 71, when the hand 33 is in contact with the distal portion 72 of the target 46.

When the diameter of the target 46 obtained from the captured position begins to be smaller, a height A, up to each contact position between the target 46 and the hand 33 from a top end of the main body 71 of the target 46, can be obtained, by using a diameter D1 of the target 46 before it begins to be smaller and a diameter D2 of the target 46 after it has become smaller. Namely, the height A can be calculated by the following equation.

$$A = (D1-D2)/(2 \cdot \tan \alpha)$$

When the diameter of the target 46 obtained from each captured position begins to be smaller, the control unit 23 can obtain the position of the target 46 in the Z axial direction, by calculation, based on a position along the Z axial direction of the distal end of the arm 32 as well as on the height A obtained as described above. In the memory 26, information indicating such an equation for the calculation is stored in advance as a shape of the target 46. With such information, the position of the target 46 in the Z axial direction can be obtained, by calculation, from each captured position.

The robot 22 is configured for carrying the wafer 24. In order to carry in and carry out each wafer 24 relative to the cassette 25 that conforms to the SEMI (Semiconductor Equipment and Materials International) standard, the hand 33 of the robot 22 should be formed to have a thickness within a range of from 2 to 4 mm. Namely, the thickness exceeding such a range cannot be applied to the hand 33. In addition, in view of the size of each wafer 24, the length of the hand 33 should be set within a range of approximately 200 to 300 mm. In the case in which such a hand 33 would be moved in the Z axial direction so as to be brought into contact with a plane, as a target, for example, extending perpendicular to the Z axial direction, in order to detect each position of the plane with respect to the Z axial direction, it should be quite difficult to detect the position without deforming the hand 33. Thus, the detection error may tend to be significantly large. In this embodiment, however, the direction in which the hand 33 is moved to be in contact with the target 46 is coincident with a direction in which the hand 33 can exhibit its high rigidity. Therefore, deterioration of accuracy in the positional detection due to deformation of the hand 33 can be avoided or eliminated.

Figure 8:
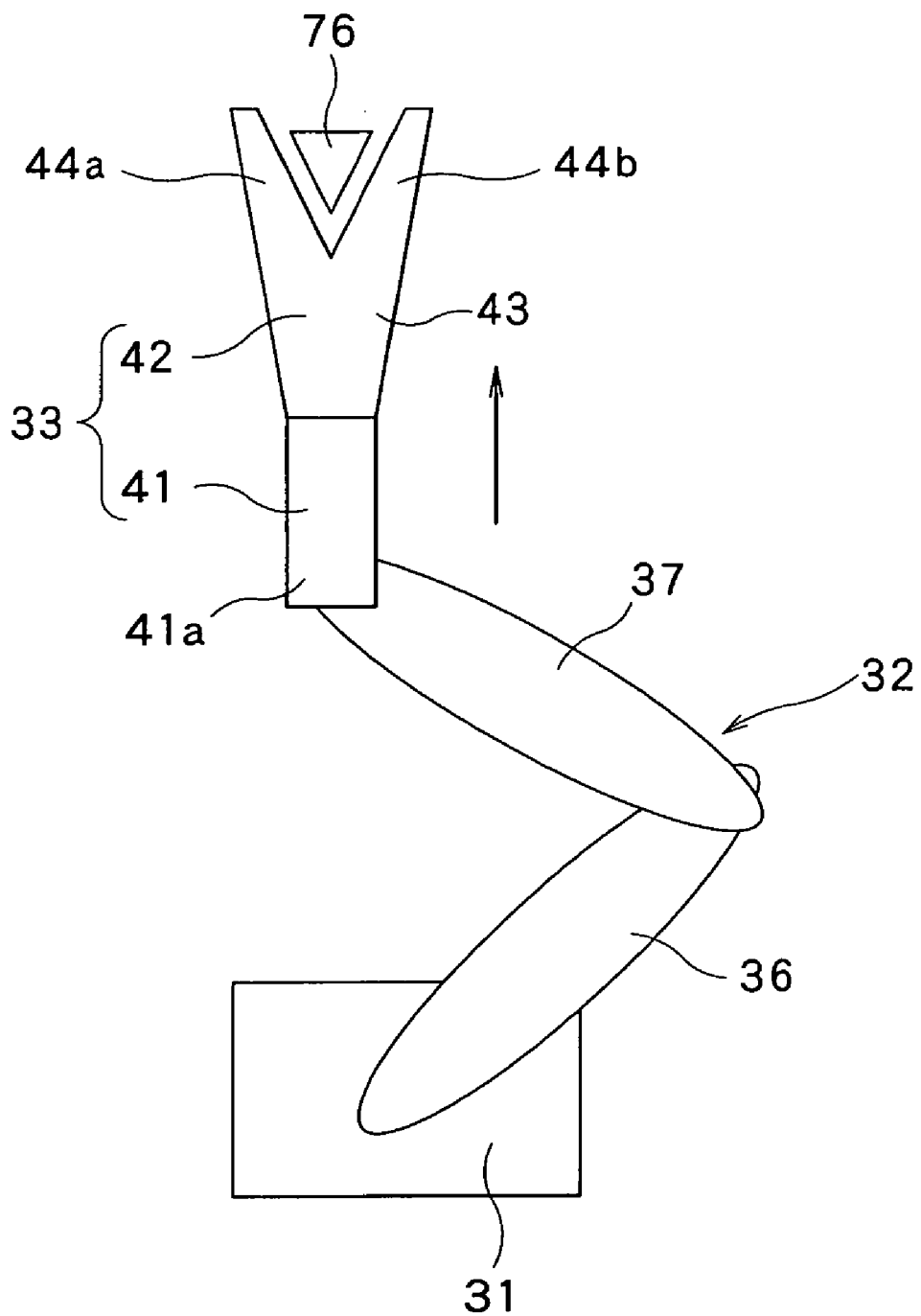
FIG. 8 is a diagram for illustrating another example of the operation for detecting the target position in the X-Y plane.

FIG. 8 is a diagram for illustrating another example of the operation for detecting the target position in the X-Y plane. In this example, a target 76 is formed to be fitted in an opening provided between the extending parts 44a, 44b of the hand 33. In this case, the shape of the target 76 may be selected such that the distance between the target 76 and the third axis L3 of the wrist axis 30 can be obtained as a unique solution when the target 76 is fitted in the hand 33. Preferably, a positional relation between the target 76 and the third axis L3 of the wrist axis 30 can be determined as a unique solution when the target 76 is fitted in the hand 33. In this embodiment, the target 76 has a triangular section perpendicular to the Z axial direction.

The control unit 23 brings the hand 33 into contact with the target 76, while setting the control loop gain of each of the wrist axis 30 and arm axes 35, 38 lower than a predetermined value, at least from a position in the vicinity of the teaching point at which the target 76 is located. In this manner, since the control loop gain of each of the wrist axis 30 and arm axes 35, 38 is positively decreased, the hand 33 can be brought into contact with the target 76 with adequately mitigated pressing force. Accordingly, the deformation of the hand 33 and/or target 76 can be prevented as well as the occurrence of particles can be avoided or eliminated.

In this embodiment, the control unit 23 brings the hand 33 into contact with the target 76, also by setting the upper limit of driving torque of each of the wrist axis 30 and arm axes 35, 38 lower than a predetermined value, at least from a position in the vicinity of the teaching point at which the target 76 is located. Specifically, the hand 33 is driven at a low speed to approach and contact with the target 76, while the robot 22 is advanced along the target 76, against reaction force of from 20-30 gf to 100 gf exerted from the target 76. Consequently, the robot 22 can be operated to be securely fitted with the target 76.

The control unit 23 captures each position in which the hand 33 is brought into contact with the target 76. Specifically, the control unit 23 captures the current position of each of the wrist axis 30 and arm axes 35, 38, in the state in which the hand 33 is in contact with the target 76. More specifically, when a difference between the instruction value and the current value, with respect to each of the wrist axis 30 and arm axes 35, 38, exceeds a predetermined value, the control unit 23 will capture the current value of each of the wrist axis 30 and arm axes 35, 38 as the position in the state in which the hand 33 is in contract with the target 76. Due to such a capturing operation for each position in the state in which the hand 33 is in contact with the target 76, there should be no influence of the fluctuation factors in the driving system of the robot 22. Therefore, as compared with the technique disclosed in the Patent Document 1, the position of the target 76 can be detected more accurately.

In the memory 26, information indicating a positional relationship between the target 76 and the wrist axis 30, with the hand 33 being completely fitted in the target 76, is stored in advance as the shape of the hand 33. By using such information, the control unit 23 can calculate and obtain the position of the target 76 from each captured position.

In this embodiment, while the control unit 23 will capture the current value of each of the wrist axis 30 and arm axes 35, 38 when the difference between the instruction value and the current value, with respect to each of the wrist axis 30 and arm axes 35, 38, exceeds the predetermined value, the timing of capturing the current value of each of the wrist axis 30 and arm axes 35, 38 is not limited to this aspect. For instance, the current value of each of the wrist axis 30 and arm axes 35, 38 may be captured when the instruction value of each of the wrist axis 30 and arm axes 35, 38 reaches a preset value. In this case, the preset value should be set at a value such that the hand 33 can be securely in contact with the target 76.

In this embodiment, while the control loop gain of each arm axis is lowered, the control loop gain may not be lowered for all of the arm axes. For instance, the control loop gain may be lowered for only one of the arm axes.

Figure 9:
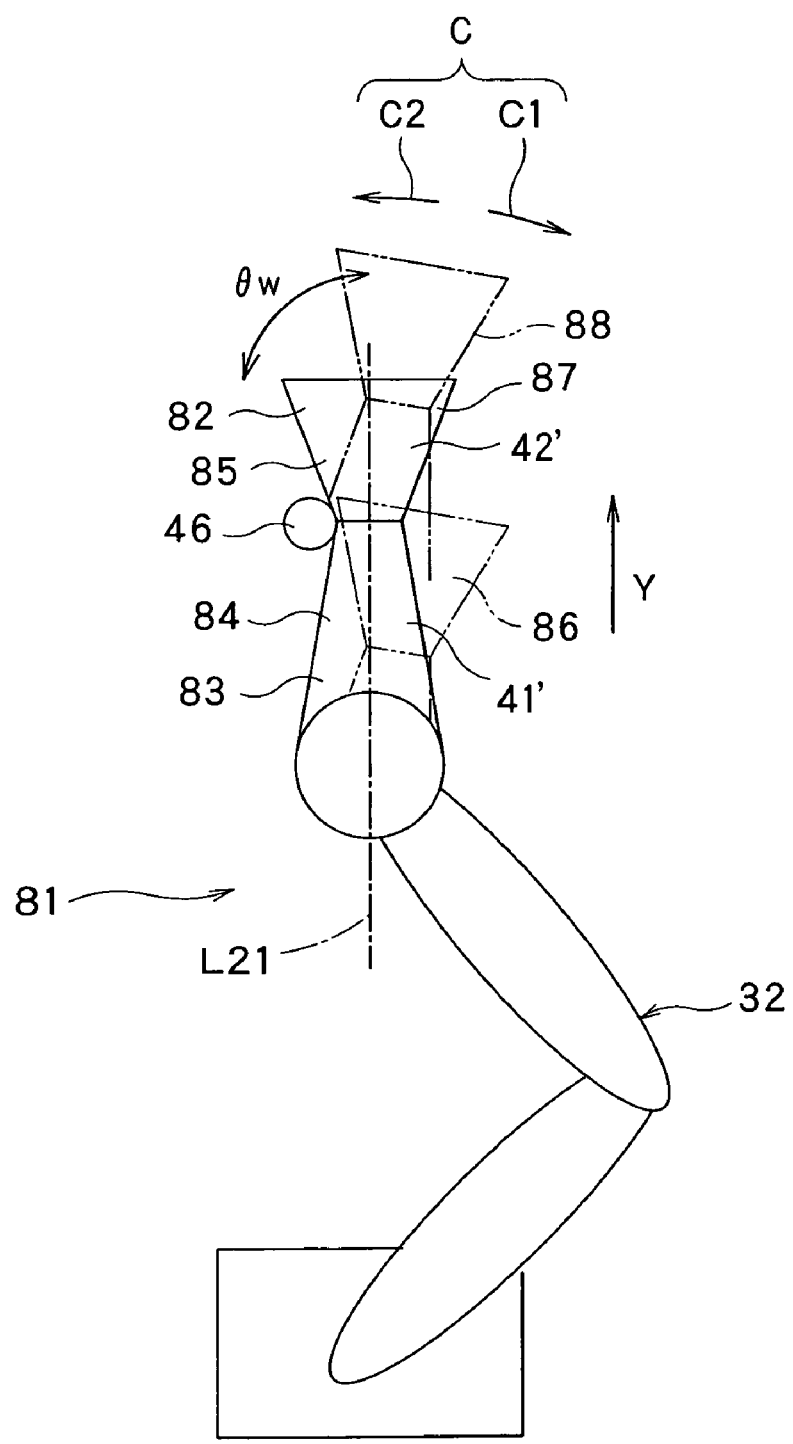
FIG. 9 is a plan view showing construction of a target position detection apparatus 81 for the robot, which is a second embodiment of the present invention.

FIG. 9 is a plan view showing the construction of a target position detection apparatus 81 for the robot, which is a second embodiment of the present invention. Since the target position detection apparatus 81 of this embodiment is substantially the same as the position detection apparatus 21 of the first embodiment described above, only differences between these apparatuses will be described below.

A hand 82 has a shape that is changed with respect to a radial direction of the wrist axis 30. The hand 82 is provided along the radial direction of the wrist axis 30. The supporting part 42' of the hand 82 has a substantially trapezoidal shape having a width that becomes greater as one moves outward in the radial direction of the wrist axis 30. The hand 82 includes a contacting portion 83 configured for contacting with the target 46. The contacting portion 83 is provided on one side of the hand 82. The contacting portion 83 is inclined to an imaginary plane including the wrist axis 30, wherein the angle of inclination is changed as one moves outward in the radial direction of the wrist axis 30. Namely, the contacting portion 83 includes a first inclination part 84 that is inclined in the one circumferential direction C1 of the wrist axis 30 as one moves outward in the radial direction of the wrist axis 30, and a second inclination part 85 that is connected with the first inclination part 84, located outside in the radial direction of the wrist axis 30 relative to the first inclination part 84, and inclined in the other circumferential direction C2 of the wrist axis 30 as one moves outward in the radial direction of the wrist axis 30. In this embodiment, the first inclination part 84 is provided to the connecting part 41' and the second inclination part 85 is provided to the supporting part 42'.

The control unit 23 brings the contacting portion 83 of the hand 82 into contact with the target 46, while setting the control loop gain of the wrist axis 30 lower than a predetermined value, at least from a position in the vicinity of the teaching point at which the target 46 is located. The control loop gain of the wrist axis 30 may be lowered after the hand 82 is moved up to the position in the vicinity of the teaching point at which the target 46 is located, or otherwise may be lowered from the start. With such a lowering operation for the control loop gain of the wrist axis 30, the hand 82 can be in contact with the target 46 with adequately reduced pressing force. Accordingly, the deformation of the hand 82 and/or target 46 can be prevented as well as the occurrence of particles can be avoided or eliminated.

First, the control unit 23 brings the contacting portion 83 of the hand 33, specifically the second inclination part 85, into contact with the target 46. Thereafter, the control unit 23 moves the distal end of the arm 32 along a preset straight line L21 in the X-Y plane, with the contacting portion 83 of the hand 82 being contacted with the target 46. The preset straight line L21 is parallel to the Y axial direction.

In this case, the control unit 23 captures, in succession, each position in which the hand 82 is in contact with the target 46, while moving the distal end of the arm 32 as described above. Specifically, the control unit 23 captures the current value of each of the wrist axis 30 and arm axes while the contacting portion 83 of the hand 82 is in contact with the target 46. In this way, since the control unit 23 captures each position in the state in which the contacting portion 83 of the hand 82 is in contact with the target 46, there should be no influence due to the fluctuation factors in the driving system of the robot 22. Accordingly, as compared with the technique disclosed in the Patent Document 1, the position of the target 46 can be detected with higher accuracy.

First, the hand 82 is located in a position as depicted by imaginary lines 86. The hand 82 is then moved in the other circumferential direction C2 of the wrist axis 30 as the distal end of the arm 32 is advanced toward the target 46. Once a point at which the first inclination part 84 and second inclination part 85 are connected with each other reaches the target 46, the hand 82 is located in a position as depicted by solid lines 87. Thereafter, with further advancement of the distal end of the arm 32 toward the target 46, the hand 82 will be moved in the one circumferential direction C1 of the wrist axis 30 and located in a position as depicted by imaginary lines 88.

Figure 10:
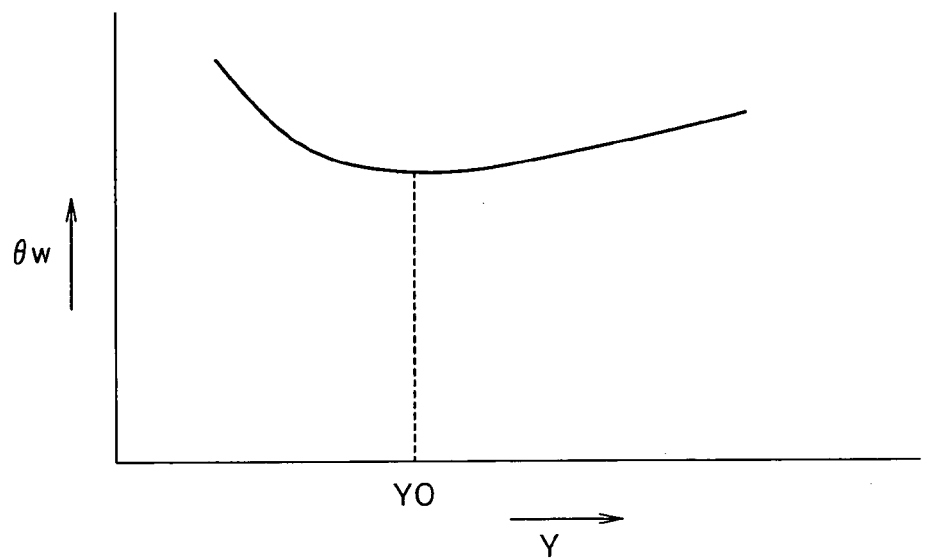
FIG. 10 is a graph of a position captured by a control unit 23.

FIG. 10 is a graph of each position captured by the control unit 23. The horizontal axis Y designates the current value, with respect to the Y axial direction, of the distal end of the arm 32, and the vertical axis $\theta W$ designates the current value of the wrist axis 30. The value of Y is increased as the distal end of the arm 32 is advanced toward the target 46. The value of $\theta W$ is increased as the hand 82 is advanced in the one circumferential direction C1 of the wrist axis 30.

As shown in FIG. 10, a line designating a relationship between the value of Y and the value of $\theta W$ is convex downward. Namely, a value $Y0$ of Y, by which the value of $\theta W$ becomes minimum, can be considered as a value obtained at a time when the target 46 is located at a point at which the first inclination part 84 and second inclination part 85 are connected with each other. Accordingly, based on such a value $Y0$ of Y, the position of the target 46 in the X-Y plane can be detected.

In the memory 26, information indicating a positional relationship between the target 46 and the wrist axis 30, when the target 46 is located at the point at which the first inclination part 84 and second inclination part 85 are connected with each other, is stored in advance, as a shape of the hand 82. With such information, the control unit 23 can calculate and obtain the position of the target 46, based on the value $Y0$ of Y that makes the value of $\theta W$ minimum.

Figure 11:
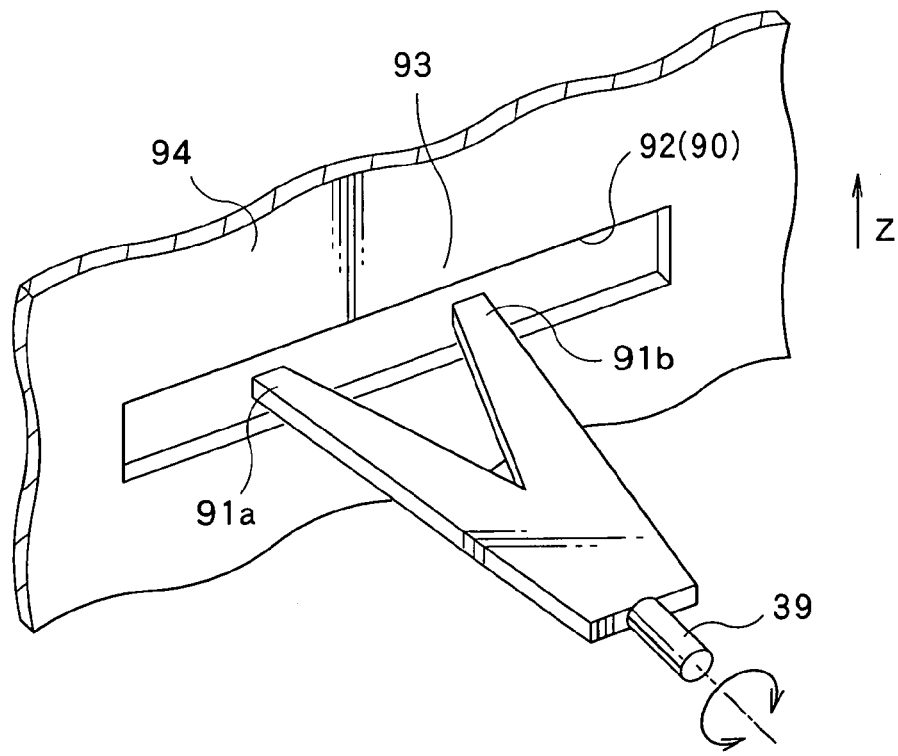
FIG. 11 is a perspective view showing a part of the target position detection apparatus for the robot, which is a third embodiment of the present invention.

FIG. 11 is a perspective view showing a part of the target position detection apparatus for the robot, which is a third embodiment of the present invention. Since the target position detection apparatus of this embodiment is substantially the same as the position detection apparatus of the first embodiment described above, only differences between these apparatuses will be described below.

The robot 22 includes a flip axis 39 provided at the wrist axis 30. The hand 33 includes a pair of distal ends 91a, 91b provided to be spaced away from the flip axis 39 in a direction perpendicular to the flip axis 39. The distal ends 91a, 91b are provided to be symmetrical about an imaginary plane including the flip axis 39. Each distal end 91a, 91b corresponds to the distal end of each extending part 44a, 44b of the hand 33.

A target 90 is provided as an opening-forming part, in which an opening 92 extending perpendicularly relative to the Z axial direction is formed. Such an opening-forming part is provided, for example, in a partition wall 94 used for separating a carrier space from a processing space. The carrier space means a space through which the wafer 24 is carried by the robot 22. The processing space means a space in which the wafer 24 is processed by a processing apparatus.

In this case, the control unit 23 brings the distal ends 91a, 91b of the hand 33 into contact with the target 90, while setting the control loop gain of the flip axis 39 lower than a predetermined value as well as swaying the flip axis 39, at least from a position in the vicinity of the teaching point at which the target 90 is located. Consequently, the distal ends 91a, 91b of the hand 33 can be brought into contact with the target 90, respectively, with adequately reduced pressing force. As such, the deformation of the hand 33 and/or target 90 can be prevented, as well as the occurrence of particles can be avoided.

The control unit 23 detects the position of the target 90 in the Z axial direction, by capturing positions in a state in which the distal ends 91a, 91b of the hand 33 are respectively in contact with the target 90. In this way, since the control unit 23 captures each position in which the distal ends 91a, 91b of the hand 33 are respectively in contact with the target 90, there should be no influence of the fluctuation facts in the driving system of the robot 22. Accordingly, as compared with the technology disclosed in the Patent Document 1 described above, the position of the target 90 in the Z axial direction can be detected with significantly higher accuracy.

More specifically, the control unit 23 moves each distal end 91a, 91b of the hand 33 such that it will be positioned in the opening 92, while shifting each distal end 91a, 91b of the arm 32 in the Z axial direction such that a swaying angle of the flip axis 39 will be maximum, thereby detecting a position of such a maximum swaying angle as a central position in the Z axial direction of the opening 92. Thus, the central position in the Z axial direction of the opening 92 can be detected with ease and higher accuracy.

In this embodiment, while the target 90 has been described as the opening-forming part in which the opening 92 is provided to extend in the direction perpendicular to the Z axial direction, the target 90 may not be provided with such an opening 92. For instance, the target 90 may be a plane extending parallel to the X-Y plane, or otherwise may be of a columnar shape as employed in the first embodiment described above.

Figure 12:
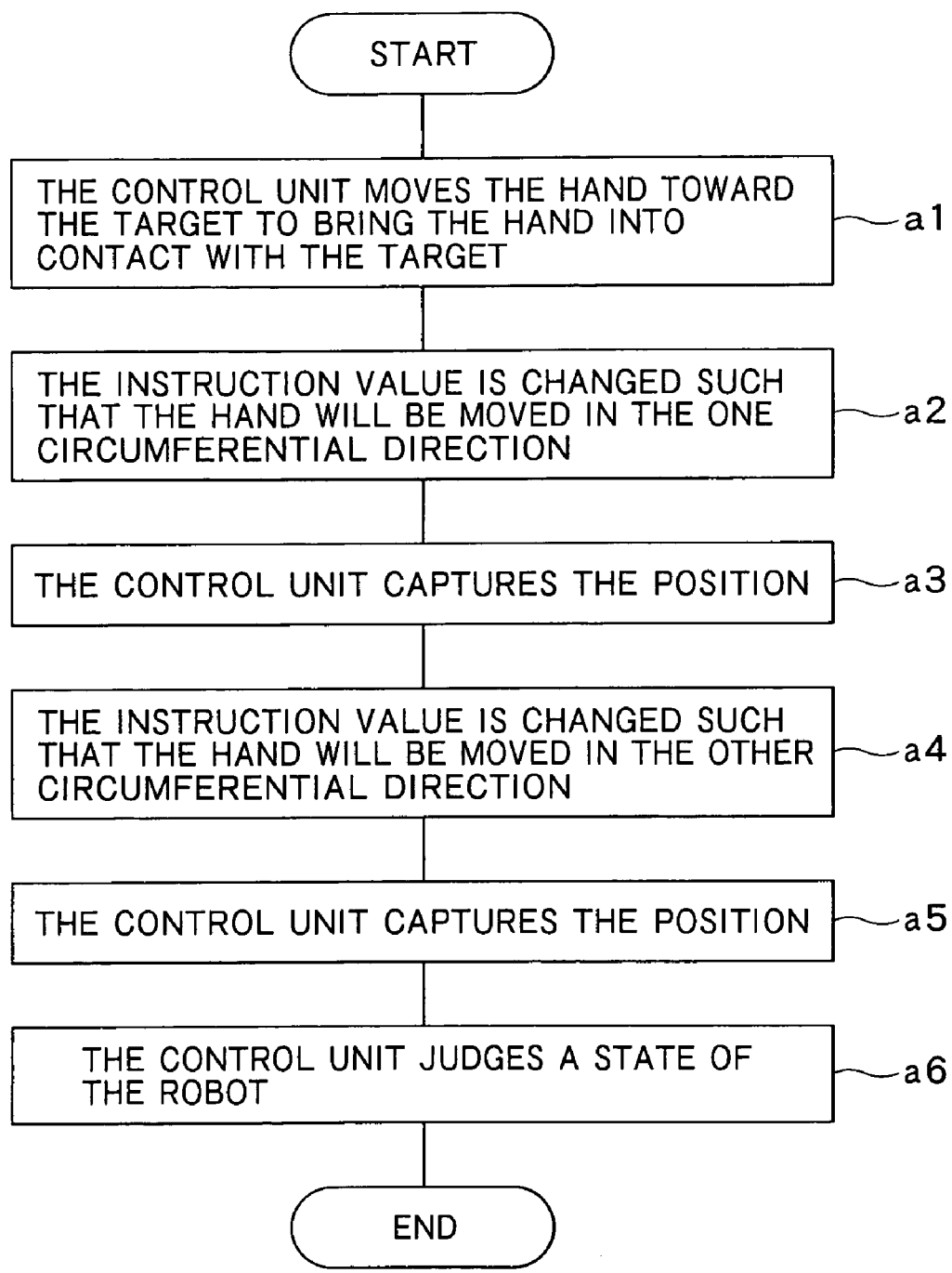
FIG. 12 is a flow chart for illustrating a self-diagnosis operation by using the control unit 23 included in a self-diagnosis apparatus for the robot, which is a fourth embodiment of the present invention.
Figure 13:
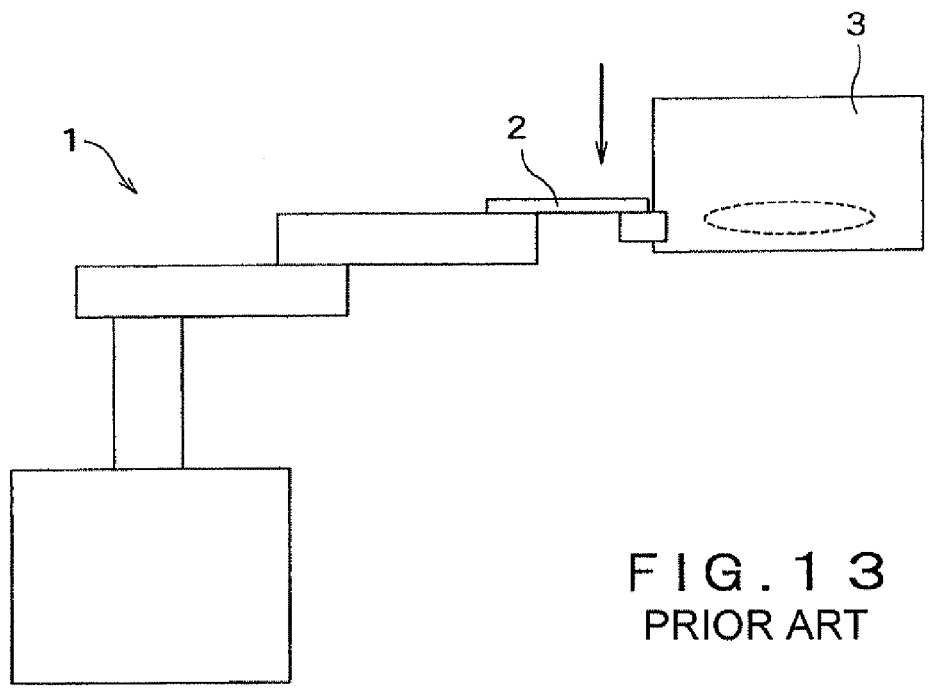
FIG. 13 is a front view of a conventional robot 1.
Figure 14:
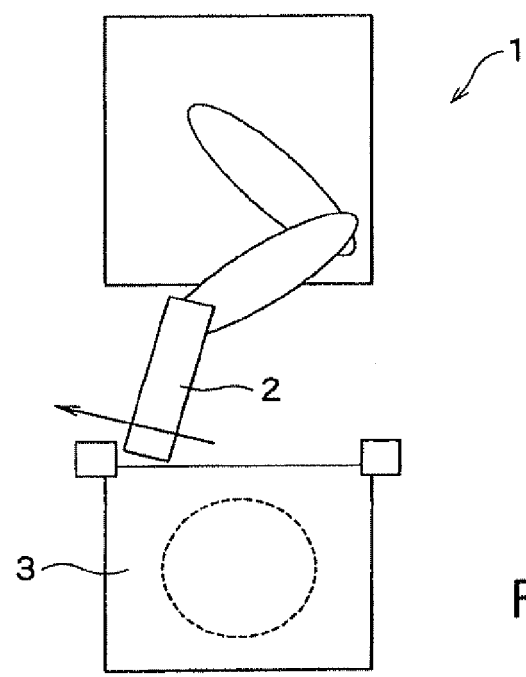
FIG. 14 is a plan view of the conventional robot 1.

FIG. 12 is a flow chart for illustrating a self-diagnosis operation by using the control unit 23 included in a self-diagnosis apparatus for the robot, which is a fourth embodiment of the present invention. Since the self-diagnosis apparatus of this embodiment is substantially the same as the position detection apparatus 21 of the first embodiment described above, only differences between these apparatuses will now be described. The self-diagnosis operation performed by using the control unit 23 is started when a teaching for starting the self-diagnosis operation is provided. For instance, such a teaching for starting the self-diagnosis is provided by an operator.

In a step a1, when the self-diagnosis operation is started, the control unit 23 moves the hand 33 toward the target 46 by controlling each driving unit 55 to 58. At this time, the control unit 23 brings the hand 33 into contact with the target 46, while setting the control loop gain of the wrist axis 30 as well as setting the control loop gain of each arm axis 35, 38 lower than each predetermined value. Therefore, the hand 33 can be in contact with the target 46 with adequately reduced pressing force. Thus, the deformation of the hand 33 and/or target 46 can be effectively prevented as well as the occurrence of particles can be avoided.

Next, in a step a2, the instruction value of the wrist axis 30 is changed such that the hand 33 will be moved in the one circumferential direction C1, while only the control loop gain of the wrist axis 30 is set lower than the predetermined value, with the angular displacement of the hand 33 about the wrist axis 30 being prevented by the target 46. Then, in a step a3, the position after the change will be captured. Specifically, when the difference between the instruction value of the wrist axis 30 and the current value of the wrist axis 30 exceeds a preset value, this current value of the wrist axis 30 will be captured as the position after the change.

Thereafter, in a step a4, the instruction value of the wrist axis 30 is changed such that the hand 33 will be moved in the other circumferential direction C2, while only the control loop gain of the wrist axis 30 is set lower than the predetermined value, with the angular displacement of the hand 33 about the wrist axis 30 being prevented by the target 46. Then, in a step a5, the position after the change will be captured. Specifically, when the difference between the instruction value of the wrist axis 30 and the current value of the wrist axis 30 exceeds a predetermined value, this current value of the wrist axis 30 will be captured as the position after the change.

Next, in a step a6, the control unit judges a state of the robot 22, especially a state of the wrist axis 30, based on the difference between the captured positions. In this case, the difference between the captured positions means the difference between the position captured in the step a3 and the position captured in the step a5. Such a difference between the captured positions will be increased as back lash or hysteresis of the wrist axis 30 becomes greater. Accordingly, the state of the wrist axis can be readily judged based on the difference between the captured positions. Such a difference between the captured positions may be accumulated in the memory 26. Thereafter, the self-diagnosis operation will be ended.

After such judgment on the state of the wrist axis 30, each captured position may be corrected, in each of the position detection apparatuses 21, 81 of the first and second embodiments, based on the result of judgment. In this manner, the position of the target can be detected with higher accuracy, regardless of a state of the robot.

In each of the steps a1, a2, a4 of the above embodiment, the upper limit of the driving torque of the wrist axis 30 may also be set lower than a predetermined value. With such an operation, the deformation of the hand 33 and/or target 46 can be securely prevented, as well as the occurrence of particles can be successfully avoided. In this embodiment, while the state of the wrist axis 30 is judged, a state of each arm axis 35, 38 may also be judged in the same manner.

While this invention has been discussed with reference to the several embodiments described above, such embodiments have been shown and described by way of example only. Therefore, various modifications and/or variations can be made without departing from the spirit and scope of this invention. For instance, the work described above is not limited to the wafer 24, and may be a glass substrate for use in producing a liquid crystal display panel.

What is claimed is:

1. A target position detection apparatus for a robot, comprising:
    a robot including an arm configured to be freely moved in at least two directions of X and Y axes, the arm having a wrist axis provided at a distal end of the arm and configured to be freely moved in a horizontal direction, and the wrist axis being provided with an end effector; and
    a control unit adapted for driving a memory to store a teaching point therein and controlling an operation of the robot such that the end effector will be moved toward the teaching point stored in the memory,
    wherein the control unit is further adapted for changing a pressing force of the end effector against a target by changing a control loop gain, and bringing the end effector into contact with the target, while setting the control loop gain of the wrist axis lower than a predetermined value at least from a position adjacent to the teaching point at which the target is located, so as to capture a position in a state in which the end effector is in contact with the target, thereby detecting the position of the target.

2. The target position detection apparatus for the robot according to claim 1, wherein a driving unit for driving the wrist axis is configured to detect a position with a predetermined accuracy.

3. The target position detection apparatus for the robot according to claim 1
    wherein the control unit is adapted for:
    driving the memory to store a shape of the end effector therein; and
    calculating the position of the target in an X-Y plane, based on the shape of the end effector stored in the memory as well as on the position captured.

4. The target position detection apparatus for the robot according to claim 3,
    wherein the end effector has a V-like shape in the X-Y plane, and
    wherein the control unit is adapted for moving the distal end of the arm to a plurality of positions in the X-Y plane, and bringing two points located on an inside of the end effector into contact with the target by swaying the wrist axis at each of the plurality of positions, thereby capturing each position in the state in which the end effector is in contact with the target.

5. The target position detection apparatus for the robot according to claim 3,
    wherein the end effector has a shape that is changed with respect to a radial direction of the wrist axis, and
    wherein the control unit is adapted for capturing the position in the state in which the end effector is in contact with the target, while moving the distal end of the arm in the X-Y plane with the end effector being in contact with the target.

6. The target position detection apparatus for the robot according to claim 1
    wherein the distal end of the arm of the robot is configured to be freely moved in three axial directions of X, Y and Z axes,
    wherein the target has a shape that is changed with respect to the Z axial direction, and
    wherein the control unit is adapted for:
    driving the memory to store the shape of the target therein; and
    calculating the position of the target in the Z axial direction, based on the shape of the target stored in the memory as well as on the position captured.

7. The target position detection apparatus for the robot according to claim 1
    wherein the arm is composed of a SCARA-type horizontal articulated arm having a plurality of joints, and
    wherein the control unit is adapted for bringing the end effector into contact with the target, while setting the control loop gain of each of the wrist axis and an arm axis lower than a predetermined value at least from a position adjacent to the teaching point at which the target is located, so as to capture the position in the state in which the end effector is in contact with the target, thereby detecting the position of the target.

8. The target position detection apparatus for the robot according to claim 7, wherein a driving unit adapted for driving the arm axis is configured to detect a position with a predetermined accuracy.

9. The target position detection apparatus for the robot according to claim 1,
    wherein the robot includes a flip axis provided at the wrist axis,
    wherein the end effector has a distal end spaced away from the flip axis in a direction perpendicular to the flip axis, and
    wherein the control unit is adapted for bringing the distal end of the end effector into contact with the target, while setting the control loop gain of the flip axis lower than a predetermined value at least from a position adjacent to the teaching point at which the target is located, and swaying the flip axis, so as to capture the position in a state in which the distal end of the end effector is in contact with the target, thereby detecting the position of the target in a Z axial direction.

10. The target position detection apparatus for the robot according to claim 9,
    wherein the end effector has a pair of distal ends, each of the distal ends being symmetrically positioned about an imaginary plane including the flip axis,
    wherein the target is an opening-forming part in which an opening extending perpendicularly to the Z axial direction is formed, and
    wherein the control unit is adapted for moving each distal end of the end effector so as to be positioned in the opening, shifting the distal end of the arm in the Z axial direction such that a swaying angle of the flip axis will be maximum, thereby detecting a position of such a maximum swaying angle as a central position in the Z axial direction of the opening.

11. A self-diagnosis apparatus for a robot, comprising:
    a robot including an arm configured to be freely moved in at least two directions of X and Y axes, the arm having a wrist axis provided at a distal end of the arm and configured to be freely moved in a horizontal direction, and the wrist axis being provided with an end effector; and
    a control unit adapted for driving a memory to store a teaching point therein and controlling an operation of the robot such that the end effector is moved toward the teaching point stored in the memory,
    wherein the control unit is further adapted for:
    changing a pressing force of the end effector against a target by changing a control loop gain;
    setting the control loop gain of the wrist axis lower than a predetermined value in a state in which an angular displacement of the end effector about the wrist axis is prevented by the target, and first changing an instruction value to the wrist axis such that the end effector will be moved in one circumferential direction of the wrist axis, thereby capturing a position after changing the instruction value, and then changing the instruction value to the wrist axis such that the end effector will be moved in an other circumferential direction of the wrist axis, thereby capturing a position after changing the instruction value; and judging a state of the robot based on a difference between the positions captured.

12. The self-diagnosis apparatus for the robot according to claim 11, wherein the arm is composed of a SCARA-type horizontal articulated arm having a plurality of joints, and wherein the control unit is adapted for:

setting the control loop gain of an arm axis to be diagnosed lower than a predetermined value in a state in which the angular displacement of the end effector about the arm axis is prevented by the target, and first changing an instruction value to the arm axis such that the end effector will be moved in one circumferential direction of the arm axis, thereby capturing a position after changing the instruction value, and then changing the instruction value to the arm axis such that the end effector will be moved in an other circumferential direction of the arm axis, thereby capturing a position after changing the instruction value; and judging the state of the robot based on the difference between the positions captured.

* * * * *